(12) United States Patent
Minamihaba et al.

(10) Patent No.: US 7,307,344 B2
(45) Date of Patent: Dec. 11, 2007

(54) SEMICONDUCTOR DEVICE INCLUDING A DISCONTINUOUS FILM AND METHOD FOR MANUFACTURING THE SAME

(75) Inventors: Gaku Minamihaba, Yokohama (JP); Hiroyuki Yano, Yokohama (JP); Nobuyuki Kurashima, Yokohama (JP); Susumu Yamamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/239,077

(22) Filed: Sep. 30, 2005

(65) Prior Publication Data

US 2006/0131751 A1    Jun. 22, 2006

(30) Foreign Application Priority Data

Dec. 21, 2004    (JP) .............................. 2004-369726

(51) Int. Cl.
*H01L 23/48*    (2006.01)
*H01L 23/52*    (2006.01)
*H01L 29/40*    (2006.01)

(52) U.S. Cl. ...................... 257/758; 257/762; 257/763; 257/764; 257/765

(58) Field of Classification Search ................ 257/760, 257/762–765, 758
See application file for complete search history.

(56) References Cited

U.S. PATENT DOCUMENTS

| 6,342,444 | B1 | 1/2002 | Higashi et al. | |
| 6,818,546 | B2 * | 11/2004 | Saito et al. | 438/618 |
| 2005/0022745 | A1 | 2/2005 | Nakano et al. | |
| 2006/0060977 | A1 * | 3/2006 | Kawanoue | 257/762 |

* cited by examiner

*Primary Examiner*—Monica Lewis
(74) *Attorney, Agent, or Firm*—Finnegan, Henderson, Farabow, Garrett & Dunner, L.L.P.

(57) ABSTRACT

Disclosed is a semiconductor device comprising a semiconductor substrate, a first insulating film formed above the semiconductor substrate, Cu wiring buried in the first insulating film, a second insulating film formed above the Cu wiring, and a discontinuous film made of at least one metal selected from the group consisting of Ti, Al, W, Pd, Sn, Ni, Mg and Zn, or a metal oxide thereof and interposed at an interface between the Cu wiring and the second insulating film.

4 Claims, 2 Drawing Sheets

SEMICONDUCTOR DEVICE INCLUDING A DISCONTINUOUS FILM AND METHOD FOR MANUFACTURING THE SAME

CROSS-REFERENCE TO RELATED APPLICATIONS

This application is based upon and claims the benefit of priority from prior Japanese Patent Application No. 2004-369726, filed Dec. 21, 2004, the entire contents of which are incorporated herein by reference.

BACKGROUND OF THE INVENTION

1. Field of the Invention

This invention relates to a semiconductor device and a method for manufacturing the semiconductor device. In particular, this invention relates to a semiconductor device employing Cu wiring and to a method for manufacturing such a semiconductor device.

2. Description of the Related Art

In an attempt to practically apply Cu wiring, there has been proposed a method of selectively forming a barrier layer on the surface of Cu wiring in order to prevent the diffusion and oxidation of Cu to secure the reliability of Cu wiring. Although it is possible, through the formation of a titanium nitride film or an aluminum oxide film as a barrier layer, to reduce the interwiring capacity and to prevent the resistance of wiring from increasing, the process for forming such a barrier layer is rather complicated.

For example, in order to form a barrier layer on Cu wiring, the etching mask employed in the work for forming a trench in an insulating film is required to be left remained. Namely, under the condition where the etching mask is left remained, Cu wiring is formed in the trench of insulating film and then a barrier member such as Ti film is formed on the etching mask as well as on the Cu wiring. This barrier member is then subjected to heat treatment in a nitrogen atmosphere or in an oxygen atmosphere, thereby enabling the etching mask and the barrier member to undergo eutectic reaction and, at the same time, enabling the barrier member on the Cu wiring to nitride or oxidize. Finally, the barrier member which has undergone the eutectic reaction with the etching mask is selectively removed to selectively form a barrier layer on the Cu wiring.

As described above, the conventional process for selectively forming a barrier layer on Cu wiring is complicated, so that it is now desired to develop a more simplified process. Further, since the surface of Cu wiring is consumed through the reaction thereof with the barrier member, the prevention of increase in electric resistance of wiring is limited.

BRIEF SUMMARY OF THE INVENTION

A semiconductor device according to one aspect of the present invention comprises a semiconductor substrate; a first insulating film formed above the semiconductor substrate; Cu wiring buried in the first insulating film; a second insulating film formed above the Cu wiring; and a discontinuous film made of at least one metal selected from the group consisting of Ti, Al, W, Pd, Sn, Ni, Mg and Zn, or a metal oxide thereof and interposed at an interface between the Cu wiring and the second insulating film.

A method for manufacturing a semiconductor device according to another aspect of the present invention comprises forming a recess in a first insulating film formed above a semiconductor substrate; burying Cu wiring in the recess of the first insulating film with a barrier metal being interposed therebetween; treating the semiconductor substrate having the Cu wiring formed thereabove with an aqueous solution of metal soap containing at least one metal selected from the group consisting of Ti, Al, W, Pd, Sn, Ni, Mg and Zn and drying the aqueous solution of metal soap to form a continuous film containing an oxide of the metal and an organic compound on the Cu wiring; and forming a second insulating film above the Cu wiring while removing the organic compound from the continuous film to turn the continuous film into a discontinuous film.

A method for manufacturing a semiconductor device according to a further aspect of the present invention comprises forming a recess in a first insulating film formed above a semiconductor substrate; burying Cu wiring in the recess of the first insulating film with a barrier metal being interposed therebetween; treating the semiconductor substrate having the Cu wiring formed thereabove with an aqueous solution of metal soap containing at least one metal selected from the group consisting of Ti, Al, W, Pd, Sn, Ni, Mg and Zn and drying the aqueous solution of metal soap to form a continuous film containing an oxide of the metal and an organic compound on the Cu wiring; removing the organic compound from the continuous film to turn the continuous film into a discontinuous film; and forming a second insulating film above the Cu wiring having the discontinuous film formed thereon, wherein, throughout the process of removing the organic compound from the continuous film and forming the second insulating film, an atmosphere thereof is maintained in a reducing atmosphere or in a vacuum.

DETAILED DESCRIPTION OF THE INVENTION

Figure 1:
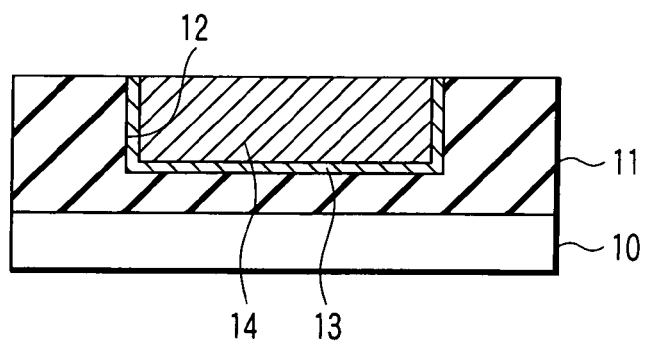
FIG. 1 is a cross-sectional view representing a step of metal soap treatment.

Next, the embodiment of the present invention will be explained with reference to the drawings.

In the semiconductor device according to one embodiment of the present invention, at least one metal selected from the group consisting of Ti, Al, W, Pd, Sn, Ni, Mg and Zn, or a metal oxide thereof is discontinuously disposed on the surface of Cu wiring. More specifically, when the surface of Cu wiring is investigated by ESCA (Electron Spectroscopy for Chemical Analysis), the quantity of metal existing thereon may be at about 10 atom % at most based on a total quantity of Cu and the metal.

The metal on the Cu wiring can be formed by the treatment thereof using a metal soap. The metal soap herein denotes, in general, non-alkaline metal salts of organic acids, examples of organic acids being a fatty acid such as butyric acid, caproic acid, caprilic acid, pelargonic acid, capric acid, undecanoic acid, lauric acid, myristic acid, palmitic acid, stearic acid, etc. Additionally, it is also possible to employ lactic acid or an organic chelate. More specifically, as for the metal soap containing Ti, specific examples thereof include Ti butyrate, Ti caproate, Ti lactate, Ti pelargonate, Ti caprate, Ti undecanoate, Ti laurate, Ti myristate, Ti palmitate, Ti stearate, Ti ethanol amine, etc. These organic acid salts and the like would be applicable likewise with respect to the metal soap containing Al, W, Pd, Sn, Ni, Mg or Zn.

In these metal soaps, the organic acid moiety or organic chelate moiety acts as a hydrophobic portion, thereby permitting the metal soaps to adsorb onto a hydrophobic surface. Since the surface of the Cu film is hydrophobic, the organic acid moiety or organic chelate moiety is enabled to adsorb onto the surface of the Cu film, thereby forming an LB (Langmuir-Blodgett) flim-like film. In order to form an LB film-like film on a substrate, it is possible to employ, for example, a method wherein a metal soap which is insoluble or highly insoluble in water gathers at the surface of liquid and adsorb onto the substrate. Alternatively, the substrate is repeatedly passed through a gas-liquid interface, thereby allowing the metal soap existing in the liquid or gathered at the surface of liquid to adsorb onto the substrate, thereby making it possible to form the LB film-like film.

In order to form a film of high density by the adsorption of a greater amount of metal onto the surface of the Cu film, it is desirable that the content of metal in a metal soap be as high as possible. Therefore, it is preferable to employ a metal soap where the fatty acid thereof is of low molecular weight and the content of metal is relatively high. In order to form a film of high density (a film which is high in content of metal), it is preferable to employ the latter method among the aforementioned methods.

The metal soap in this case is prepared by dissolving it in a solvent such as water to form an aqueous solution containing metal soap at a concentration of about 0.005-0.5% by weight. If the concentration of metal soap is less than 0.005% by weight, it would be impossible to expect a sufficient effect of metal soap. On the other hand, if the concentration of metal soap is higher than 0.5% by weight, a larger quantity of micelle than required is caused to form in an aqueous solution, thereby making it difficult to enable the metal soap to densely adsorb on a hydrophobic surface. More preferably, the concentration of metal soap in an aqueous solution should be confined within the range of about 0.01-0.1% by weight.

In the method for manufacturing a semiconductor device according to one embodiment of the present invention, an insulating film is formed above the semiconductor substrate according to the conventional process and then a wiring trench is formed as a recess. As for the material for the insulating film, there is not any particular limitation and hence it is possible to employ SiN, SiCN, SiO, SiOC, etc. On the insulating film having the wiring trench formed therein, a Cu layer is deposited with a barrier metal being interposed therebetween. Thereafter, the Cu layer is subjected to CMP to bury a Cu wiring in the wiring trench.

An aqueous solution of metal soap is then contacted with the surface of Cu wiring and allowed to dry by spin drying of 2000 rpm or so, thereby making it possible to leave the material included in the metal soap on the Cu wiring. For example, a substrate having a Cu wiring formed thereabove is dipped into an aqueous solution of metal soap. It is preferable that the surface of Cu wiring is washed in advance with an aqueous solution of organic acid. As for the organic acid, it is possible to employ citric acid and oxalic acid. The concentration of these acids may be confined within the range of about 0.005-1% by weight. When the surface of Cu wiring is washed with these acids, the adsorption of metal soap to the Cu wiring can be enhanced. Even if the organic acids are included in an aqueous solution of metal soap, it is possible to obtain almost the same effect as described above.

Incidentally, a metal soap can be selectively adsorbed onto the surface of Cu wiring by making the surface of insulating film hydrophilic. Among the insulating films, although $SiO_2$ is hydrophilic, an organic film such as SiOC is hydrophobic. In this case, SiOC can be subjected to oxygen plasma treatment so as to remove C from SiOC to turn it into $SiO_2$. Alternatively, by subjecting the organic film to a treatment using a surfactant, the organic film can be hydrophilized. As for the surfactants, it is especially preferable to employ a silicone-based nonionic surfactant which is excellent in affinity with Si.

If the metal components originally included in a metal soap and left remained on the Cu wiring existed as oxides such as titanium oxide or aluminum oxide, they can be confirmed by ESCA. Further, if the organic components in a metal soap existed as organic compounds on the Cu wiring, they can be also confirmed by the similar analytical method. Incidentally, the surface condition of Cu wiring can be confirmed by AES (Auger Electron Spectroscopy). A continuous film comprising a metal oxide and an organic compound can be referred to as an anti-oxidizing film and hence the oxidation resistance of Cu wiring can be significantly enhanced.

The continuous film comprising a metal oxide and an organic compound can act as an anti-oxidizing film for preventing the oxidation of Cu until the next step. On the Cu wiring having this continuous film, an insulating film is deposited by a conventional method to obtain a semiconductor device according to one embodiment of the present invention. If it is desired to form the insulating film by CVD for example, a heat treatment of about 250-400° C. will be performed in a vacuum, in a plasma atmosphere of ammonia, or in a hydrogen-containing atmosphere. In this heat treatment, organic compounds in the continuous film can be decomposed and removed and hence the continuous film on the Cu wiring will be turned into a discontinuous film containing metal oxide. The discontinuous film thus obtained can act to enhance the adhesion between the Cu film and the insulating film formed above the Cu film. This effect of enhancing the adhesion would become more prominent especially when the insulating film is composed of a material such as SiN, SiOC or SiCN. Although it is discontinuous, since metal oxide is interposed between the Cu wiring and the insulating film, it is also possible to expect the effect of suppressing the Cu atoms from diffusing into the insulating film.

The organic compounds can be removed from the continuous film prior to forming the insulating film. Due to the application of heat treatment ranging from 200 to 400° C., e.g. 250° C., the organic compounds can be removed from the continuous film. As a result, the continuous film comprising metal oxides and organic compounds will be turned into a discontinuous film containing metal oxides. The insulating film is formed on the Cu wiring having the discontinuous film created in this manner. When the organic compounds are removed prior to the formation of the insulating film, in order to prevent the surface of Cu wiring from being re-oxidized, throughout the entire process of the removal of the organic compounds and the formation of the insulating film, an atmosphere thereof is maintained in a reducing atmosphere or in a vacuum.

If required, the metal oxides in the discontinuous film may be reduced to remove oxygen atoms to turn it into metal. The reduction of metal oxide can be performed by using a procedure such as the irradiation of an electron beam in a vacuum. As a result, it is possible to obtain an adhesive film where metal is discontinuously disposed therein. This adhesive film where metal is discontinuously disposed therein is capable of strengthening the grain boundary of Cu, thus further enhancing the adhesion between the Cu wiring and the insulating film. As a result, this adhesive film is considered better than metal oxide in the respect that the reliability of the wiring can be further enhanced.

As described above, the discontinuous film of metal can be interposed between the Cu wiring and the insulating film through the removal of oxygen and organic compounds from the continuous film comprising metal oxides and organic compounds. With respect to the order of removing the oxygen and organic compounds from the continuous film, there is not any particular limitation. For example, the organic compounds can be removed concurrently with the removal of the oxygen. When the aforementioned electron beam irradiation is performed against the continuous film comprising metal oxides and organic compounds prior to the formation of the insulating film on the Cu wiring, the oxygen and organic compounds can be removed. In this manner, the continuous film comprising metal oxides and organic compounds can be modified into a discontinuous film containing metal. When an insulating film is formed above the Cu wiring thereafter, a discontinuous film of metal can be disposed at an interface between the Cu wiring and the insulating film. Since organic compounds are removed prior to the formation of insulating film, throughout the entire process of the electron beam irradiation against the continuous film and the formation of the insulating film, an atmosphere thereof is maintained in a reducing atmosphere or in a vacuum in order to prevent the surface of Cu wiring from being oxidized. Incidentally, the organic compounds can be reliably removed by performing heat treatment when forming the insulating film.

Further, if the insulating film is to be deposited by using a CVD apparatus provided with an electron beam irradiating component, the organic compounds and oxygen can be removed from the continuous film when forming the insulating film in a film-forming chamber. In the film-forming chamber which is filled with a reducing atmosphere or kept in a vacuum, a semiconductor substrate is placed on a hot plate and heated at a temperature ranging from 200 to 400° C., e.g. 250° C. The heating of the substrate is performed for the purpose of enhancing the reducing capability of copper oxide and for the purpose of pretreatment for forming a film. In this heating, the organic compounds can be removed from the continuous film. Further, due to the electron beam irradiation as described above, the metal oxide is reduced and hence oxygen atoms are removed, thereby turning the discontinuous film containing an oxide of metal into a discontinuous film containing metal. Subsequently, an insulating film is deposited above the Cu wiring, thereby obtaining an adhesive film where metal is discontinuously disposed at an interface between the Cu wiring and the insulating film.

As compared with the case where a metal film or a metal oxide film is provided on the entire surface of Cu wiring, the adhesive film where metal or metal oxide is discontinuously disposed is lower in quantity of metal which can be reacted with Cu. Therefore, the adhesive film is more advantageous in the respect of suppressing the rise in electric resistance of Cu wiring. Especially, when the metal existing on the Cu wiring is 10 atom % or less based on a total weight of Cu and the metal, the rise in electric resistance of Cu wiring can be considerably inhibited. The adhesive film where a metal formed through reduction is discontinuously disposed is fundamentally constituted by a metal which has been included as a component in a metal soap. However, as long as the adhesive film cannot be consumed excessively by Cu, the adhesive film may be constituted by an alloy. In this case, it is preferable that the surface of the Cu wiring is constituted by at least about 90 atom % of pure copper. Pure Cu can be distinguished from Cu alloy by ESCA.

Figure 2:
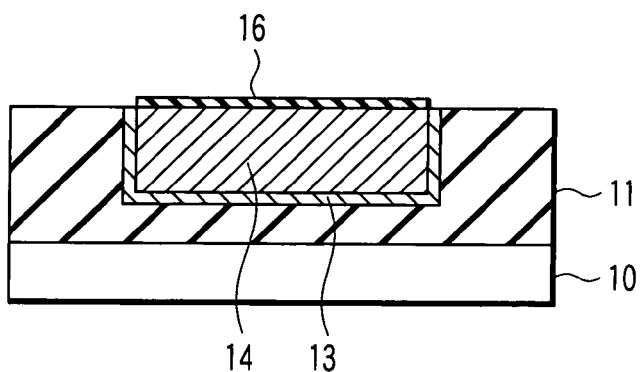
FIG. 2 is a cross-sectional view representing a next step to the step shown in FIG. 1.

Next, experimental examples will be explained wherein a continuous film was formed on a Cu wiring through the treatment with metal soap and the anti-oxidizing effects on the Cu wiring were investigated. FIGS. 1 and 2 show respectively a cross-sectional view illustrating steps of the treatment with metal soap in the experimental examples.

As shown in FIG. 1, an insulating film 11 was formed on a semiconductor substrate 10 provided with semiconductor elements (not shown) and a trench 12 was formed in the insulating film 11. In this case, the insulating film 11 was formed through the deposition of $SiO_2$. Then, a Ta film as a barrier metal film 13 and a Cu film 14 were successively deposited on the entire surface of the insulating film 11. The redundant portion of metal was removed by CMP to bury the Cu film 14 in the trench 12.

In order to investigate the oxidation resistance of exposed Cu wiring, various treatments were performed to prepare samples.

(Sample 1)

First of all, the surface of the substrate was washed for one minute with a 0.5 wt % aqueous solution of citric acid. A 0.1 wt % aqueous solution of Ti lactate was prepared as an aqueous solution of metal soap. The substrate washed as described above was dipped in this aqueous solution of Ti lactate for 3 seconds and then immersed in pure water for 3 seconds. This alternating dipping was repeated 10 times and then the surface of substrate was allowed to dry by spin drying wherein the substrate was rotated at 2000 rpm.

(Sample 2)

The surface of the substrate was treated in the same manner as in the case of the Sample 1 except that the substrate washed with an aqueous solution of citric acid was dipped in an aqueous solution of metal soap for 30 seconds and then washed with pure water.

(Sample 3)

The surface of the substrate was treated in the same manner as in the case of the Sample 1 except that a 5 wt % aqueous solution of Ti lactate was employed as an aqueous solution of metal soap.

(Sample 4)

The surface of the substrate was treated in the same manner as in the case of the Sample 1 except that a 0.1 wt % aqueous solution of Ti stearate was employed as an aqueous solution of metal soap.

(Sample 5)

The surface of the substrate was treated in the same manner as in the case of the Sample 1 except that a 0.1 wt % aqueous solution of Al lactate was employed as an aqueous solution of metal soap.

(Sample 6)

The surface of the substrate was treated in the same manner as in the case of the Sample 1 except that a 0.1 wt % aqueous solution of W lactate was employed as an aqueous solution of metal soap.

(Sample 7)

The surface of the substrate was treated in the same manner as in the case of the Sample 1 except that a 0.1 wt % aqueous solution of Pd lactate was employed as an aqueous solution of metal soap.

(Sample 8)

The surface of the substrate was treated in the same manner as in the case of the Sample 1 except that a 0.1 wt % aqueous solution of Sn lactate was employed as an aqueous solution of metal soap.

(Sample 9)

The surface of the substrate was treated in the same manner as in the case of the Sample 1 except that a 0.1 wt % aqueous solution of Ni lactate was employed as an aqueous solution of metal soap.

(Sample 10)

The surface of the substrate was treated in the same manner as in the case of the Sample 1 except that a 0.1 wt % aqueous solution of Mg lactate was employed as an aqueous solution of metal soap.

(Sample 11)

The surface of the substrate was treated in the same manner as in the case of the Sample 1 except that a 0.1 wt % aqueous solution of Zn lactate was employed as an aqueous solution of metal soap.

(Sample 12)

The surface of the substrate was treated in the same manner as in the case of the Sample 1 except that a mixed aqueous solution containing 0.05 wt % of Ti lactate and 0.05 wt % of Al lactate was employed as an aqueous solution of metal soap.

(Sample 13)

The surface of the substrate was treated in the same manner as in the case of the Sample 1 except that the washing of the substrate with an aqueous solution of citric acid was not performed and 0.5 wt % of citric acid was added to an aqueous solution of metal soap.

(Sample 14)

The surface of the substrate was treated in the same manner as in the case of the Sample 1 except that the washing of the substrate with an aqueous solution of citric acid was not performed and 0.5 wt % of oxalic acid was added to an aqueous solution of metal soap.

(Sample 15)

The surface of the substrate was treated in the same manner as in the case of the Sample 1 except that the washing of the substrate with an aqueous solution of citric acid was not performed.

For the purpose of comparison, Sample 16 was prepared without performing any surface treatment on the surface of the substrate. Further, Sample 17 was prepared in the same manner as in the case of the Sample 1 except that a 0.1 wt % aqueous solution of BTA (benzotriazole) was employed in place of the aqueous solution of metal soap. Further, Sample 18 was prepared in the same manner as in the case of the Sample 2 except that a 0.1 wt % aqueous solution of BTA (benzotriazole) was employed in place of the aqueous solution of metal soap.

When the surface of the Cu wiring in each of Samples 1 to 15 was observed by ESCA, it was confirmed that the metal included in the metal soap existed as a metal oxide and that an organic compound was adsorbed onto the surface. Namely, as shown in FIG. 2, the metal oxide and organic compound on the Cu wiring 14 were enabled to act as an anti-oxidizing film 16. The quantity of metal, as measured through the analysis by ESCA, was about 5-9 atom % based on a total amount of the metal and Cu in the case of Samples 1, 5-14. In the case of Samples 13 and 14 in particular, the quantity of metal was about 7-9 atom %. In the case of Samples 2, 3, 4 and 15, the quantity of metal was about 3 atom % based on a total amount of the metal and Cu. On the other hand, in all of the cases of comparative Samples 16 to 18, the existence of metal oxide was not recognized on the Cu wiring 14.

The samples obtained as described above were respectively subjected to baking for 10 minutes in an air atmosphere at a temperature of 200° C. and then the sheet resistance of Cu was measured by the four-probe method. Further, the rate of increase of sheet resistance of Cu on the basis of sheet resistance of Cu before the baking was determined and assessed as follows. As long as the rate of increase of sheet resistance of Cu is confined to less than 30%, it is considered acceptable.

As a result, in the case of Samples 1-15, the rate of increase of sheet resistance of Cu was all confined to less than 30%, thus confirming excellent oxidation resistance of Cu wiring. Especially, in the case of Samples 1, 5 and 12, the rate of increase of sheet resistance of Cu was all confined to less than 20%, thus confirming very excellent oxidation resistance of Cu wiring. It will be recognized from these results that Ti and Al are preferable as a metal and that the concentration of metal should preferably be 0.1 wt %. Incidentally, in the case of Samples 16-18, the rate of increase of sheet resistance of Cu was all more than 30%. This indicates that since an anti-oxidizing film did not exist on Cu wiring, the oxidation of Cu wiring proceeded.

It will be recognized from the comparison between Sample 1 and Sample 2 that when the total time of dipping is the same, it is more preferable to perform the dipping of Cu wiring into an aqueous solution of metal soap and into pure water in an alternate manner. By dipping the Cu wiring alternately into an aqueous solution of metal soap and into pure water, it is assumed that the metal soap is enabled to easily adsorb onto the surface of Cu wiring, thereby making it possible to cover the surface of Cu wiring with an LB film-like film. Further, the lactic acid functioning as a hydrophobic moiety in Sample 1 is lower in molecular weight than that of stearic acid of Sample 4. It is clear from the comparison between Sample 1 and Sample 4 that, because of the aforementioned fact, the lactic acid was enabled to effectively adsorb, as a monomolecule, onto the surface of Cu wiring, thereby making it possible to obtain excellent results.

As seen from the results described above, when the anti-oxidizing film 16 is formed on the Cu wiring 14 as shown in FIG. 2, the oxidation of Cu wiring 14 can be effectively prevented. This method is also applicable to the bonding step of Cu where oxidation resistance of the Cu surface exposed on the occasion of opening a pad is needed or to the prevention of oxidation after the fusion of the Cu fuse.

Figure 3:
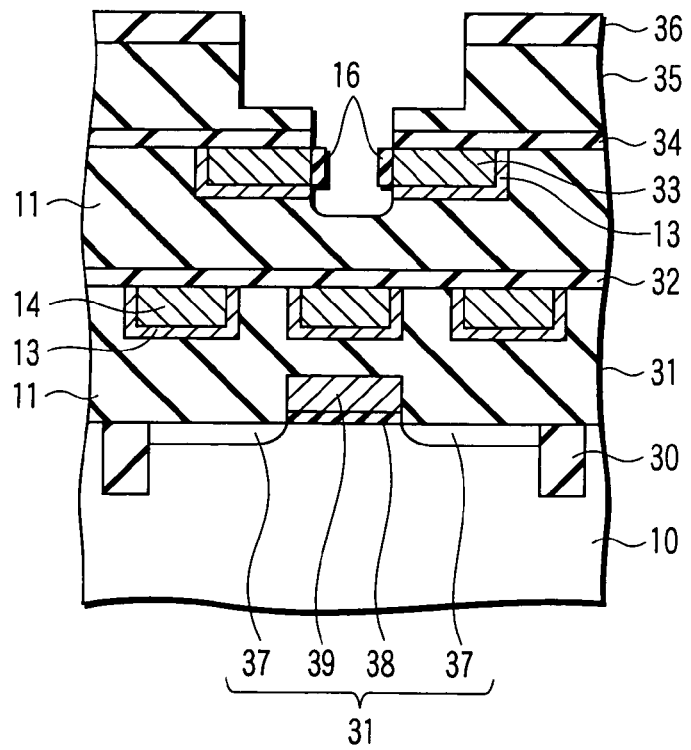
FIG. 3 is a cross-sectional view representing one example of a semiconductor device to which the metal soap treatment was applied.

One example of such an application is illustrated in the cross-sectional view of FIG. 3. The semiconductor device shown in FIG. 3 illustrates a state where the aforementioned method is applied thereto after the cutting of the Cu fuse electrode of redundancy circuit. This structure can be manufactured by the following method. The semiconductor substrate 10 is provided with a source/drain region 37 which is formed within a region encircled by an element isolating insulation film 30, and with a gate electrode 39 which is disposed, via a gate insulating film 38, on the substrate 10. As a result, a semiconductor element 31 is created in the semiconductor substrate 10. Then, a first interlayer insulating film 11 is formed so as to cover this semiconductor element 31. A Cu wiring 14 is buried, via a barrier metal film 13, in this first interlayer insulating film 11.

Before a first top barrier 32 is formed on the Cu wiring 14, the Cu wiring 14 is subjected to metal soap treatment according to the method described above to form an anti-oxidizing film (not shown) consisting of a continuous film comprising metal oxide and an organic compound on the surface of Cu wiring 14. When depositing the first top barrier 32 consisting of silicon nitride for example, the organic compound is decomposed and removed from this anti-oxidizing film, thereby creating a state where metal oxide is discontinuously disposed thereon, the metal oxide acting as an adhesive film (not shown).

On the first top barrier 32, an n-th ($n \geq 2$) interlayer insulating film 11 is formed. In this n-th interlayer insulating film 11, a Cu fuse electrode 33 is buried via a barrier metal film 13. In the same manner as in the case of the Cu wiring 14, the Cu fuse electrode 33 is subjected to metal soap treatment before a second top barrier 34 is formed on the Cu fuse electrode 33 to form an anti-oxidizing film (not shown). In the same manner as described above, when depositing the second top barrier 34, the organic compound is decomposed and removed from this anti-oxidizing film, thereby creating a discontinuous film of metal oxide (not shown).

On this second top barrier 34, a first passivation layer 35 consisting of $SiO_2$ and a second passivation layer 36 consisting of SiN are successively deposited. By RIE working, a redundancy window is formed in each of these passivation layers 35 and 36 and the cutting of the fuse is performed by the irradiation of a laser beam. Due to the heat of the laser, the passivation layers 35 and 36, the second top barrier 34, the Cu fuse electrode 33 and the barrier metal 13 are melted and splashed away to cut out the fuse.

When the Cu fuse is cut out in this manner, pure Cu is exposed from a sidewall. This region is then subjected to metal soap treatment according to the method described above to form an anti-oxidizing film 16, thereby making it possible to prevent the oxidation of the Cu fuse electrode 33.

Next, there will be more specifically explained the semiconductor device according to one embodiment of the present invention wherein an insulating film is formed on a Cu wiring having a continuous film thereon by metal soap treatment, thereby turning the continuous film on the Cu wiring into a discontinuous film.

EMBODIMENT 1

Figure 4:
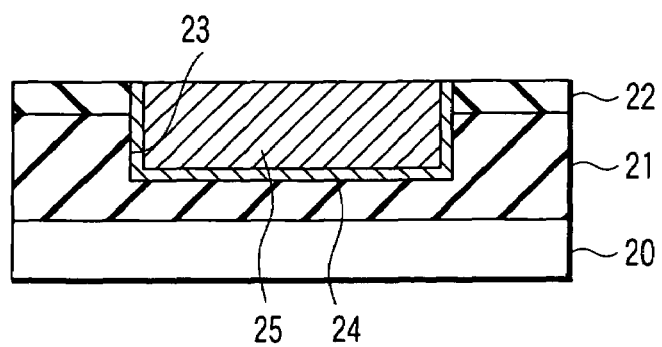
FIG. 4 is a cross-sectional view representing a step in the manufacturing method of the semiconductor device according to Embodiment 1.
Figure 5:
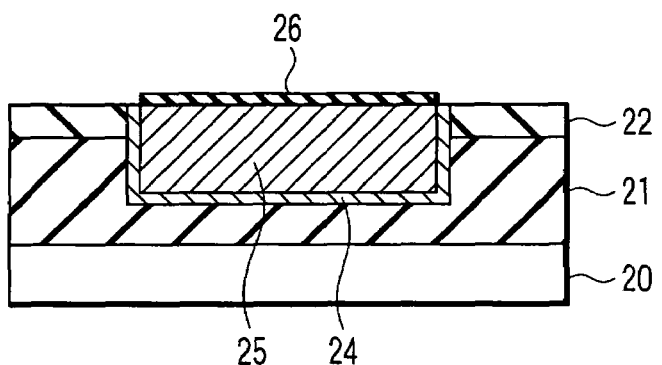
FIG. 5 is a cross-sectional view representing a next step to the step shown in FIG. 4.
Figure 6:
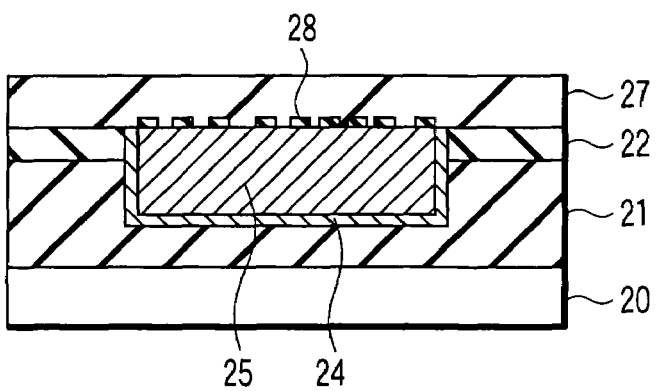
FIG. 6 is a cross-sectional view representing a next step to the step shown in FIG. 5.

FIGS. 4 to 6 show respectively a cross-sectional view illustrating the step of manufacturing the semiconductor device according to Embodiment 1.

First of all, as shown in FIG. 4, a lower low dielectric constant insulating film 21 and a upper low dielectric constant insulating film 22 are successively deposited on a semiconductor substrate 20 having a semiconductor element (not shown) thereon to form a laminated insulating film. The lower low dielectric constant insulating film 21 can be created by using a low dielectric constant material having a relative dielectric constant of less than 2.5. For example, the lower low dielectric constant insulating film 21 can be created by using at least one selected from the group consisting of a film having a siloxane skeleton such as polysiloxane, hydrogen silsesquioxane, polymethyl siloxane, methylsilsesquioxane, ect.; a film containing, as a major component, an organic resin such as polyarylene ether, polybenzooxazole, polybenzocyclobutene, etc.; and a porous film such as porous silica film, etc. In this embodiment, LKD (JSR Co., Ltd.) was employed for forming the lower insulating film 21.

The upper insulating film 22 formed on the lower insulating film 21 acts as a cap insulating film and can be formed by using an insulating material having a larger relative dielectric constant than that of the lower insulating film 21. For example, the upper insulating film 22 can be formed by using at least one insulating material having a relative dielectric constant of 2.5 or more and selected from the group consisting of TEOS (tetraethoxy silane), SiC, SiCH, SiCN, SiOC and SiOCH. In this embodiment, SiOC was employed for forming the upper insulating film 22.

Then, a trench 23 is formed in the laminated insulating film and a barrier metal film and a Cu film were deposited on the entire surface according to a conventional method. Redundant portion of metal was removed by CMP to bury a Cu wiring 25 in the trench 23. Herein a Ti film was employed as the barrier metal film 24.

Then, the Cu wiring 25 was treated with an aqueous solution of metal soap to selectively form an adhesive film 26 on the surface of the Cu wiring 25 as shown in FIG. 5, thereby preparing a sample. As explained above, since this SiOC is hydrophobic, the Cu wiring 25 was subjected to hydrophilization treatment prior to dipping the Cu wiring 25 in an aqueous solution of metal soap, thereby preparing the samples of examples.

EXAMPLE 1

First of all, a sample was dipped for 30 seconds in a 0.05 wt % aqueous solution of a silicone surfactant to hydrophilize the surface of the insulating film. Thereafter, the surface of the sample was treated in the same manner as in the case of the Sample 1.

EXAMPLE 2

First of all, a sample was dipped for 30 seconds in a 0.05 wt % aqueous solution of a silicone surfactant to hydrophilize the surface of the insulating film. Thereafter, the surface of the sample was treated in the same manner as in the case of the Sample 1 except that a 0.1 wt % aqueous solution of Al triethanol amine was employed as an aqueous solution of metal soap.

Further, Comparative Example 1 was obtained without performing the metal soap treatment.

On each of the samples of Examples 1 and 2 and Comparative Example 1, SiOC was deposited to form an insulating film 27 as shown in FIG. 6. When depositing SiOC, a heat treatment of about 250-400° C., e.g. about 350° C., was performed in a vacuum, in a plasma atmosphere such as ammonia, or in a hydrogen-containing atmosphere. In this heat treatment, the organic compound was decomposed and removed, thereby obtaining a discontinuous film 28 where the metal oxide was discontinuously disposed.

Thereafter, by CMP according to a conventional method, a mechanical stress was imposed on the insulating film 27, which was then subjected to a peeling test. If peeling was not generated at all as a result of inspection of 100,000 Cu patterns of 100 $\mu m^2$, the sample was determined as "OK". If peeling was generated under the same conditions, the sample was determined as "NG".

In the case of Examples 1 and 2, the samples were all found "OK". Whereas in the case of Comparative Example 1, the sample thereof was found "NG". It was confirmed from these results that it was possible, because of the provision of the discontinuous film at the interface through the employment of metal soap, to considerably enhance the adhesion between the Cu wiring and the insulating film.

After the deposition of SiOC, samples were obliquely sliced so as to expose the interface between the SiOC and the Cu, and then, this interface was analyzed by ESCA, the quantity of metal was about 5-10 atom % based on a total weight of the metal and Cu. Further, as a result of ESCA analysis, the existence of an organic compound was not recognized, thereby confirming that the organic compound was decomposed and removed.

In these examples, the CMP of the insulating film 27 was performed in order to evaluate the adhesion property thereof. Actually however, the wiring shown in FIG. 6 would be laminated to form a structure of around 10 ply to accomplish a semiconductor device. In this case, since the wiring would be subjected to at least 10 times the CMP stress, an increased magnitude of film stress and heat stress, each corresponding in magnitude to a total of about 10-ply structure, would be imposed on the wiring. Therefore, the adhesive strength between the Cu wiring and the insulating film is required to be sufficiently high.

EMBODIMENT 2

By following the same procedures as in the case of aforementioned Embodiment 1, a structure shown in FIG. 4 was obtained. After the same treatment as in the cases of Examples 1 and 2 was applied to the surface of Cu wiring 25, SiOC was deposited as shown in FIG. 6 to form an insulating film 27. As in the case of Embodiment 1, the organic compound was decomposed and removed on the occasion of forming the insulating film 27, thereby forming a discontinuous film 28 between the Cu wiring 25 and the insulating film 27.

The substrate having the insulating film 27 thereof was placed on a hot plate heated at a temperature of 350° C. and irradiated with the electron beam under a reduced pressure of 10 Torr. The conditions of electron beam irradiation were: 25 keV in acceleration voltage; and 500 $\mu C/cm^2$ in irradiation dosage. The electron beam was irradiated at three angles, i.e. 30°, 60° and 90°, thereby obtaining three samples.

Due to the electron beam irradiation, the metal oxide included in the discontinuous film 28 formed between the Cu wiring 25 and the insulating film 27 was reduced to a state of metal. Namely, it was possible, through the electron beam irradiation through the insulating film 27, to reduce the metal oxide formed in the metal soap treatment into metal.

The insulating film 27 was polished to expose the interface between the Cu wiring 25 and the insulating film 27 and this interface portion was observed by ESCA and AES. As a result, the discontinuous film 28 was found as being in a state of metal and also found to intermittently exist on the surface of Cu wiring. In all of the samples, the quantity of metal on the surface of Cu wiring was 5-7 atom % based on a total weight of the metal and Cu.

Incidentally, when the adhesion of samples was assessed by following the same procedure as in the case of Embodiment 1, peeling was not recognized at all, thereby confirming that these samples were excellent in adhesion.

A heat treatment may be performed after the reduction of metal oxide into metal to promote the alloying of the metal. In this case, it may be possible to strengthen the crystal grain boundary or to initiate a reaction among the Cu, the metal in the metal soap, and Si, so that adhesion of Cu wiring with the insulating film may be enhanced, thus further enhancing the reliability. As explained above, due to the provision of a discontinuous film between the Cu wiring and the insulating film, it is also possible to expect effects of suppressing the diffusion of Cu atom into the insulating film. At the same time, it is also possible to expect the enhancement in strength of the crystal grain boundary of metal atoms, thus making it possible to further enhance the reliability of wiring.

According to one aspect of the present invention, it is possible to provide a semiconductor device provided with Cu wiring and excellent in reliability. According to another aspect of the present invention, it is possible to provide a method for easily manufacturing a semiconductor device provided with Cu wiring and excellent in reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a first insulating film formed above the semiconductor substrate;
   Cu wiring buried in the first insulating film;
   a second insulating film formed above the Cu wiring; and
   a discontinuous film made of at least one metal selected from the group consisting of Ti, Al, W, Pd, Sn, Ni, Mg and Zn, or a metal oxide thereof, the discontinuous film being intermittently interposed in intervals at an interface between the Cu wiring and the second insulating film.

2. The semiconductor device according to claim 1, wherein the quantity of the metal interposed at an interface between the Cu wiring and the second insulating film is not more than 10 atom % based on a total quantity of the Cu and the metal existing at a surface of the Cu wiring.

3. The semiconductor device according to claim 1, wherein the metal is Ti or Al.

4. The semiconductor device according to claim 1, wherein the second insulating film is formed of SiN, SiO or SiCN.

* * * * *